United States Patent
Zhou et al.

(10) Patent No.: US 7,423,877 B2
(45) Date of Patent: Sep. 9, 2008

(54) HEAT DISSIPATION DEVICE

(75) Inventors: Shi-Wen Zhou, Shenzhen (CN); Peng Liu, Shenzhen (CN); Guo Chen, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 32 days.

(21) Appl. No.: 11/309,616

(22) Filed: Sep. 1, 2006

(65) Prior Publication Data

US 2008/0055854 A1 Mar. 6, 2008

(51) Int. Cl.
*H05K 7/20* (2006.01)
*F28F 7/00* (2006.01)
*H01L 23/34* (2006.01)

(52) U.S. Cl. ............ 361/700; 165/80.3; 165/104.33; 165/185; 257/722; 361/697; 361/703

(58) Field of Classification Search ............... D13/179; 165/80.3, 104.33; 361/697, 700, 703; 257/722
See application file for complete search history.

(56) References Cited

U.S. PATENT DOCUMENTS

| | | | |
|---|---|---|---|
| 3,149,666 A * | 9/1964 | Coe | 165/121 |
| 6,233,146 B1 * | 5/2001 | Gilchrist et al. | 361/687 |
| 6,390,181 B1 * | 5/2002 | Hall et al. | 165/80.3 |
| D476,958 S * | 7/2003 | Tsai | D13/179 |
| D485,901 S * | 1/2004 | Luo | D23/411 |
| 6,691,768 B2 * | 2/2004 | Hsieh et al. | 165/80.3 |
| D500,745 S * | 1/2005 | Duan et al. | D13/179 |
| 6,915,844 B2 | 7/2005 | Chou | |
| D509,483 S * | 9/2005 | Watanabe et al. | D13/179 |
| 6,942,016 B2 * | 9/2005 | Kobayashi et al. | 165/47 |
| 6,978,829 B1 * | 12/2005 | Lin | 165/104.33 |
| 7,152,666 B2 * | 12/2006 | Chen et al. | 165/80.3 |
| 7,170,746 B2 * | 1/2007 | Watanabe et al. | 361/697 |
| D537,418 S * | 2/2007 | Watanabe et al. | D13/179 |
| 7,256,996 B2 * | 8/2007 | Egbert et al. | 361/695 |
| 7,289,330 B2 * | 10/2007 | Lu et al. | 361/710 |
| 2002/0195229 A1 * | 12/2002 | Hsieh et al | 165/80.3 |
| 2006/0158850 A1 * | 7/2006 | Lee et al. | 361/700 |
| 2006/0278376 A1 * | 12/2006 | Hsieh | 165/122 |
| 2007/0146995 A1 * | 6/2007 | Zhao et al. | 361/697 |
| 2007/0242433 A1 * | 10/2007 | Lin et al. | 361/697 |

* cited by examiner

*Primary Examiner*—Gregory D Thompson
(74) *Attorney, Agent, or Firm*—Frank R. Niranjan (57) ABSTRACT

A heat dissipation device includes a heat-absorbing member having two arched concave walls formed at opposite sides thereof, and a plurality of fins extending outwardly and slantwise from each of the two arched concave walls of the heat-absorbing member toward a middle between a front and a rear of the heat dissipation device.

19 Claims, 8 Drawing Sheets

HEAT DISSIPATION DEVICE

FIELD OF THE INVENTION

The present invention relates to a heat dissipation device, and more particularly to a heat dissipation device with a heat sink formed by aluminum extrusion and having a peculiar structure which enables the heat dissipation device to have an enhanced heat dissipating capability and improved versatility.

DESCRIPTION OF RELATED ART

As computer technology continues to advance, electronic components such as the central processing units (CUPS) of computers are being made to provide faster operational speeds and greater functional capabilities. When a CPU operates at high speed in a computer enclosure, its temperature usually increases enormously. It is therefore desirable to dissipate the generated heat of the CPU quickly before damage is caused.

Figure 8:
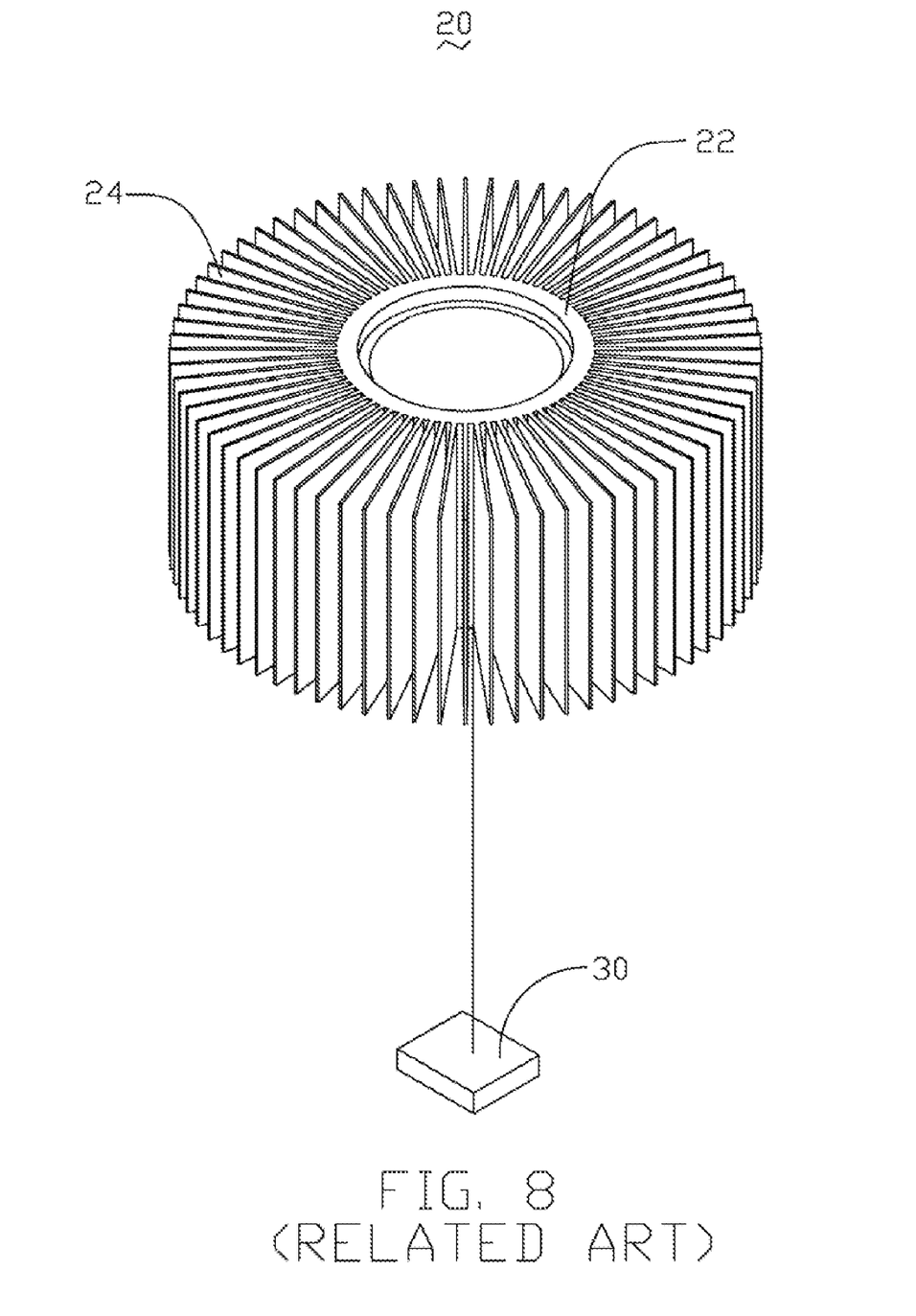
FIG. 8 is a perspective view of a heat dissipation device in accordance with related art.

A heat dissipation device 20 in accordance with related art is illustrated in FIG. 8. The heat dissipation device 20 comprises a heat-conducting block 22 for contacting with an electronic component 30 (for example, a CPU) to be cooled, and a plurality of fins 24 radially and outwardly extending from the heat-conducting block 22. Heat originating at the component 30 is first absorbed by the heat-conducting block 22, and then is conducted to the fins 24 to be dissipated to ambient air. However, the contacting area between the fins 24 and the heat-conducting block 22 is so small that the heat accumulated at the heat-conducting block 22 can not be quickly conducted to the fins 24 so as to be dissipated. Thus, the heat dissipation device 20 does not make good use of the fins 24 to dissipate the heat. This adversely affects the heat dissipating efficiency of the heat dissipation device 20.

What is needed, therefore, is a heat dissipation device, which can overcome the above-described disadvantages of the related art.

SUMMARY OF THE INVENTION

A heat dissipation device comprises a heat-absorbing member made by metal extrusion. The heat-absorbing member has a cuboidal configuration with two arched concave walls formed at two opposite lateral sides thereof, respectively. A plurality of fins extends outwardly from each of the two arched concave walls of the heat-absorbing member. The plurality of fins at each of the two opposite lateral sides of the heat-absorbing member is divided into a front group and a rear group. The fins of each of the groups extend slantwise and outwardly toward a middle of the heat-absorbing member between front and rear faces of the heat-absorbing member. The fins of each of the groups are parallel to each other. Free edges of the fins of the same group form two flat side surfaces perpendicular to each other.

Other advantages and novel features will become more apparent from the following detailed description of preferred embodiments when taken in conjunction with the accompanying drawings, in which:

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
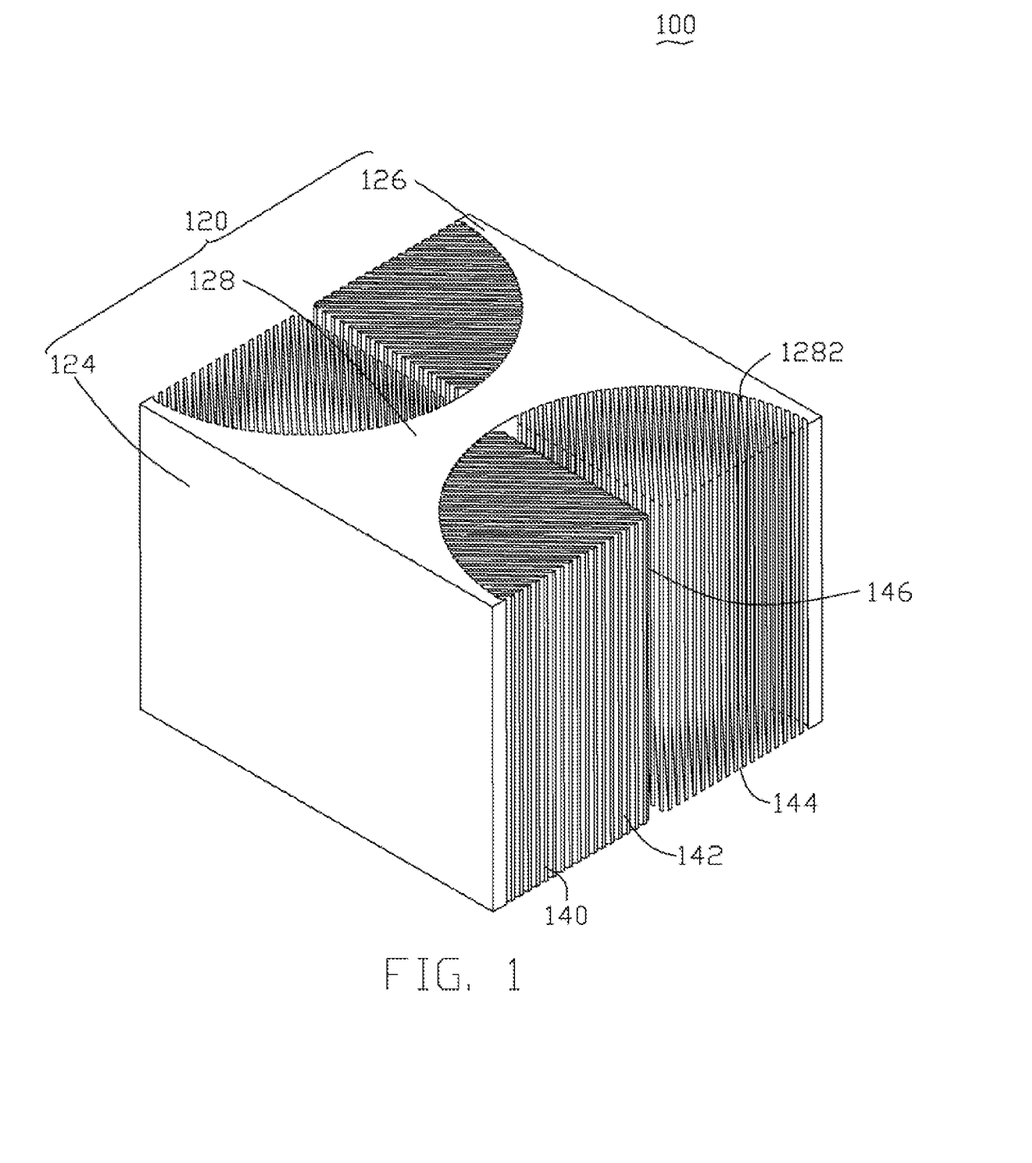
FIG. 1 is an isometric view of a heat dissipation device in accordance with a first preferred embodiment.

Referring to FIG. 1, a heat dissipation device 100 in accordance with a first preferred embodiment is illustrated. The heat dissipation device 100 has a symmetrical structure and comprises a heat-absorbing member 120 and a plurality of fins 140 extending from the heat-absorbing member 120. The heat-absorbing member 120 and the fins 140 are integrally formed by aluminum extrusion, thereby to reduce the heat resistance between the heat-absorbing member 120 and the fins 140. This avails to quickly conduct heat from the heat-absorbing member 120 to the fins 140.

The heat-absorbing member 120 is a solid metal block, and can be divided into three parts, namely, a rectangular front plate 124, a rectangular rear plate 126 and a spreader 128 with opposite front and rear ends thereof respectively integrally formed with the front plate 124 and the rear plate 126.

The front plate 124 and the rear plate 126 each have a flat outer surface, and the spreader 128 also has a flat top surface and a flat bottom surface opposite the top surface, wherein the four flat surfaces of the heat-absorbing member 120 are provided for selectively contacting with a heat source such as a central processing unit (CPU) mounted on a printed circuit board in a computer enclosure (not shown).

The spreader 128 is so configured that it has two opposite lateral sides constituting a hyperbola. A width of the spreader 128 is gradually decreased from the front plate 124 and the rear plate 126 towards a middle of the spreader 128, whereby two semicircular concave walls 1282 are formed at the two opposite lateral sides of the spreader 128 between the front plate 124 and the rear plate 126. In other words, two semicircular recesses are formed at the two opposite sides of the spreader 128, respectively, and located between the front plate 124 and the rear plate 126.

The fins 140 extend outwardly from the semicircular concave walls 1282 of the spreader 128. Each of the fins 140 has a top surface (not labeled) coplanar with the top surface of the spreader 128 and a bottom surface (not labeled) coplanar with the bottom surface of the spreader 128. The arrangement of the fins 140 at one side of the spreader 128 is a mirror image of the fins 140 at the opposite side of the spreader 128. At each lateral side of the spreader 128, a channel 146 is defined to divide the fins 140 thereof into a front group 142 and a rear group 144 which is a mirror image of the front group 142 regarding the channel 146. The channel 146 is laterally extended at a middle of the heat-absorbing member 120 between the front plate 124 and the rear plate 126.

In the front group 142, the fins 140 cooperatively define a quadrant-shaped column, which has an arced side surface (not labeled) and two flat side surfaces (not labeled) perpendicular to each other. The two flat side surfaces are formed by free edges of the fins 140. The arced side surface of the column is in common with a portion of a corresponding semicircular concave wall 1282 of the spreader 128, while one flat surface of the column is perpendicular to the flat surface of the front plate 124 and the other is parallel therewith. Still in the front group 142, the fins 140 are oriented at a same direction, which points slantwise and outwardly toward the channel 146. In the first group 142, the fins 140 are parallel to each other. Finally, the fins 140 in each group are oriented to a same direction different from that of any of the other groups.

During operation, one of the flat surfaces of the front plate 124, the rear plate 126 and the spreader 128 is selected to contact with the CPU. Then, the absorbed heat is quickly spread to the whole heat-absorbing member 120 via the spreader 128. Finally, the heat accumulated on the heat-absorbing member 120 is conducted to the fins 140 along different directions via the semicircular concave walls 1282 of the spreader 128 before the heat is dissipated by the fins 140 to a surrounding environment.

As described above, there are four flat surfaces of the heat-absorbing member 120 for selectively contacting with the CPU according to the space in the computer enclosure provided for mounting the heat dissipation device 100. Therefore, the heat dissipation device 100 has an improved versatility. Furthermore, the semicircular concave walls 1282 provide larger contacting areas between the fins 140 and the heat-absorbing member 120 than that of the heat dissipation device 20 as shown in FIG. 8, when dimensions of the heat dissipation device 100 and the heat dissipation device 200 are the same. Therefore, the heat dissipation device 100 can make good use of the fins 140 and the heat dissipating efficiency of the heat dissipation device 100 is improved.

Figure 2:
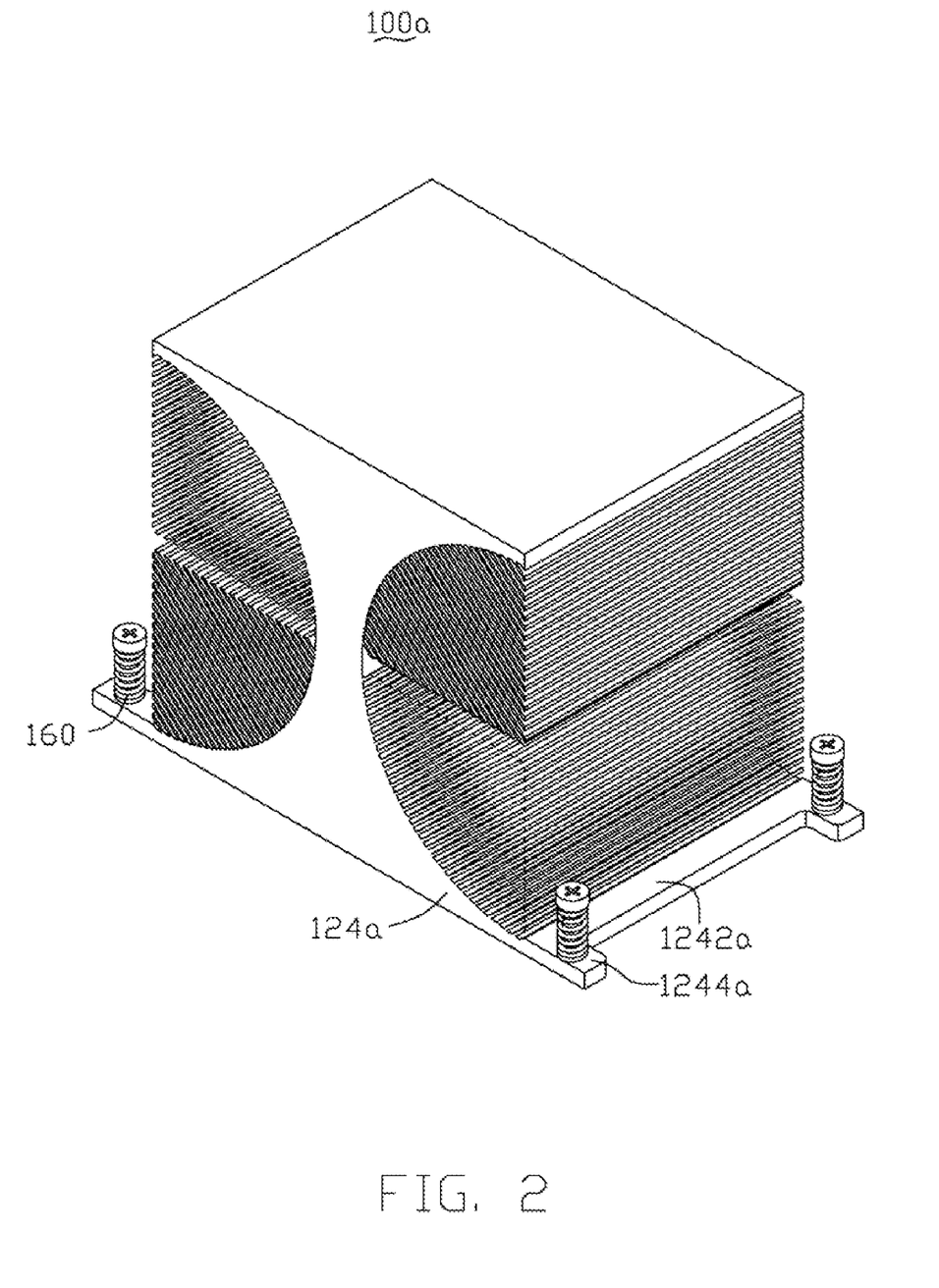
FIG. 2 is an isometric view of a heat dissipation device in accordance with a second preferred embodiment.

FIG. 2 shows a heat dissipation device 100*a* similar to the heat dissipation device 100. However, the heat dissipation device 100*a* has mounting ears 1244*a* mounted with mounting members 160, respectively, for mounting the heat dissipation device 100*a* on the CPU. The mounting ears 1244*a* extend integrally and outwardly from opposite flanges 1242*a* of the front plate 124*a* of the heat dissipation device 100*a*. In this embodiment, each flange 1242*a* of the front plate 124*a* is provided with two of the mounting ears 1244*a* at top and bottom ends thereof, respectively. Each mounting ear 1244*a* defines a through hole (shrouded by the corresponding mounting member 160 in FIG. 2) therein, for the mounting member 160 to extend therethrough so as to secure the heat dissipation device 100*a* onto the CPU.

The heat dissipation devices 100, 100*a*, illustrated above, remove the heat originating from the CPU away via heat conduction of metal. In order to further improve the heat dissipating capability, the heat dissipation devices 100, 100*a* may be used in combination with other heat dissipating components, such as heat pipes and electric fans, which can further improve the heat dissipation effect of the heat dissipation devices 100, 100*a*. The relationships between the heat dissipation device and the related heat dissipating components will be illustrated in following disclosure in detail.

Figure 3:
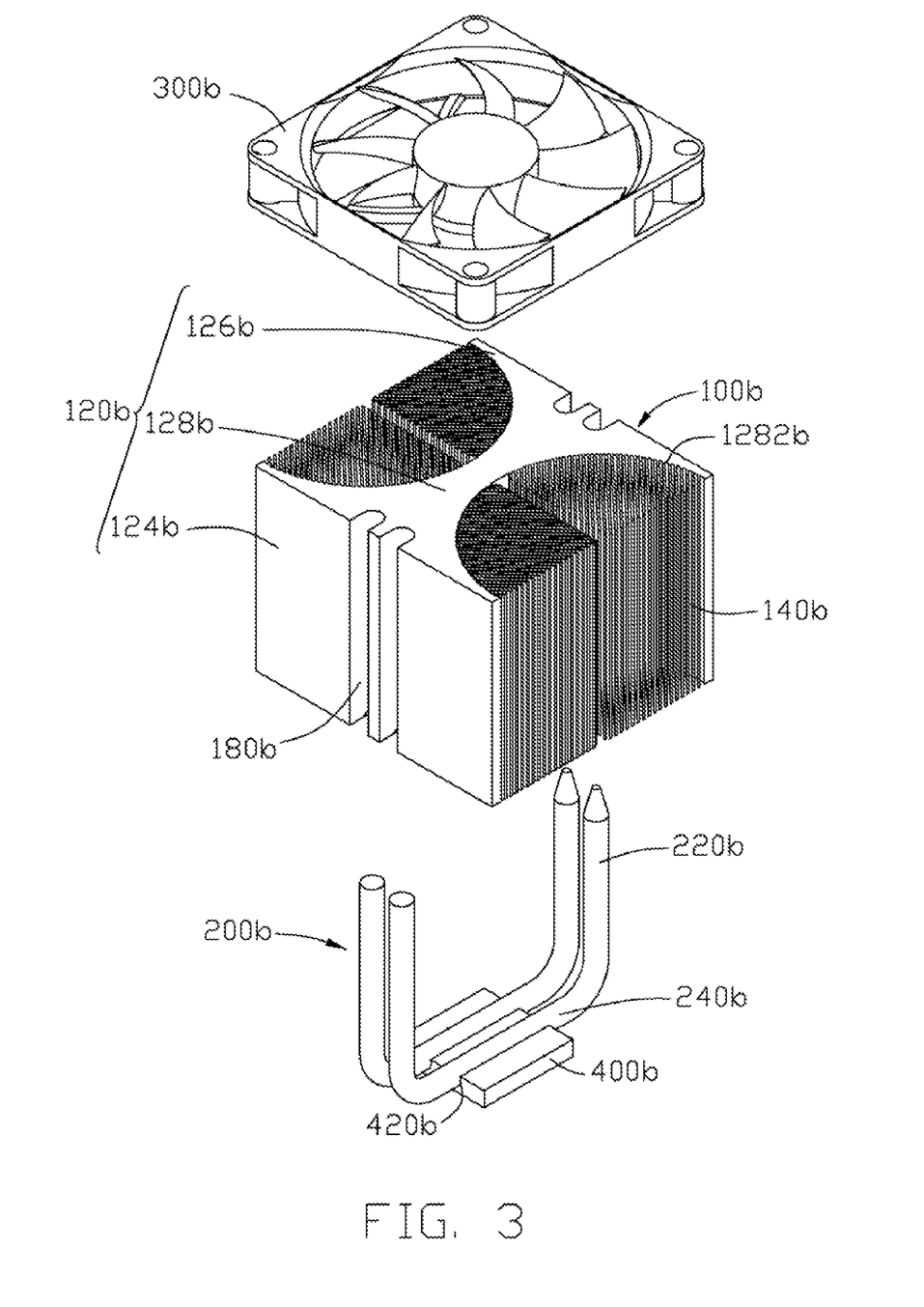
FIG. 3 is an isometric view of a heat dissipation device in accordance with a third preferred embodiment, together with related heat dissipating components.
Figure 4:
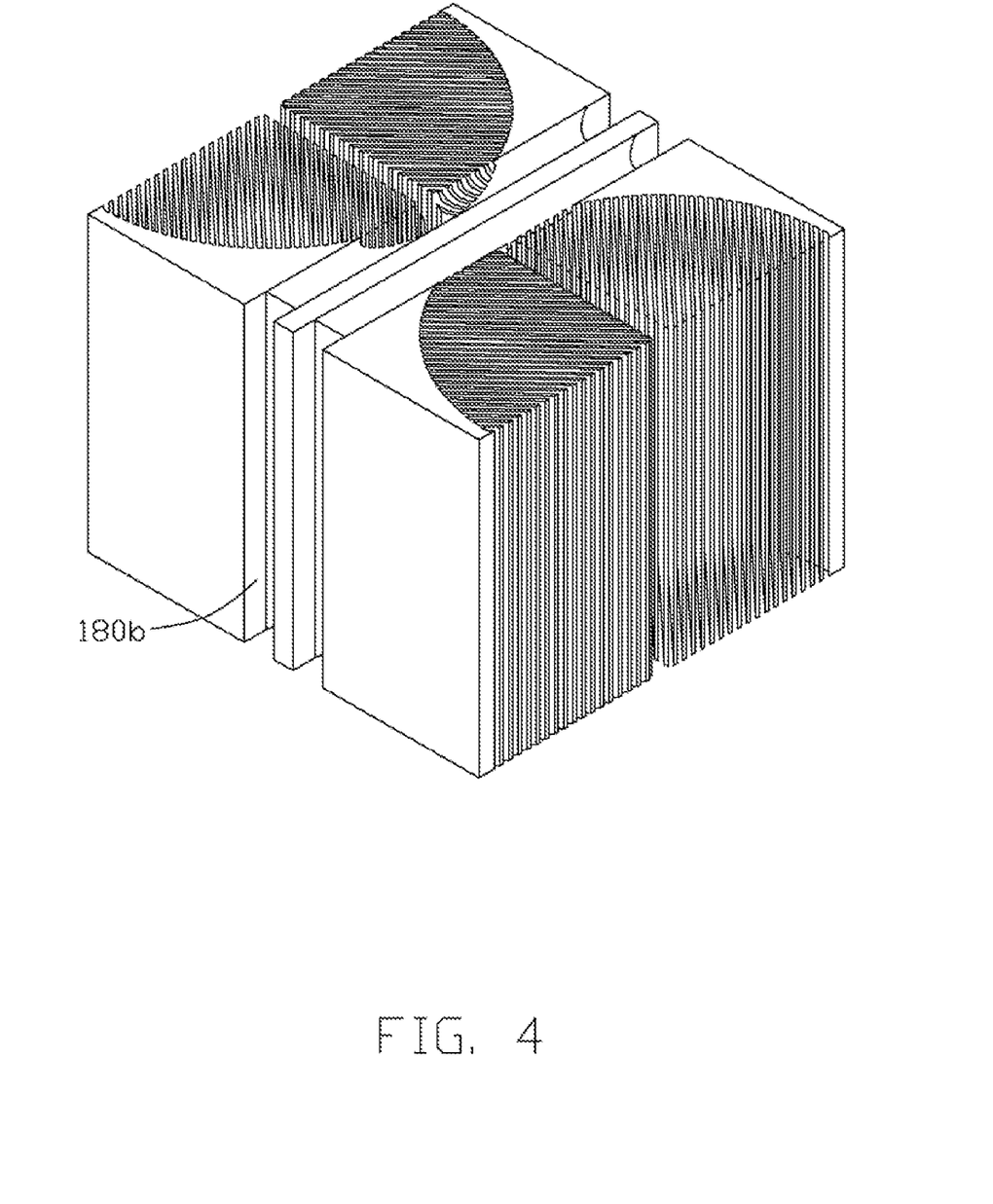
FIG. 4 is an isometric view of the heat dissipation device of FIG. 3, as viewed from a bottom aspect thereof.
Figure 5:
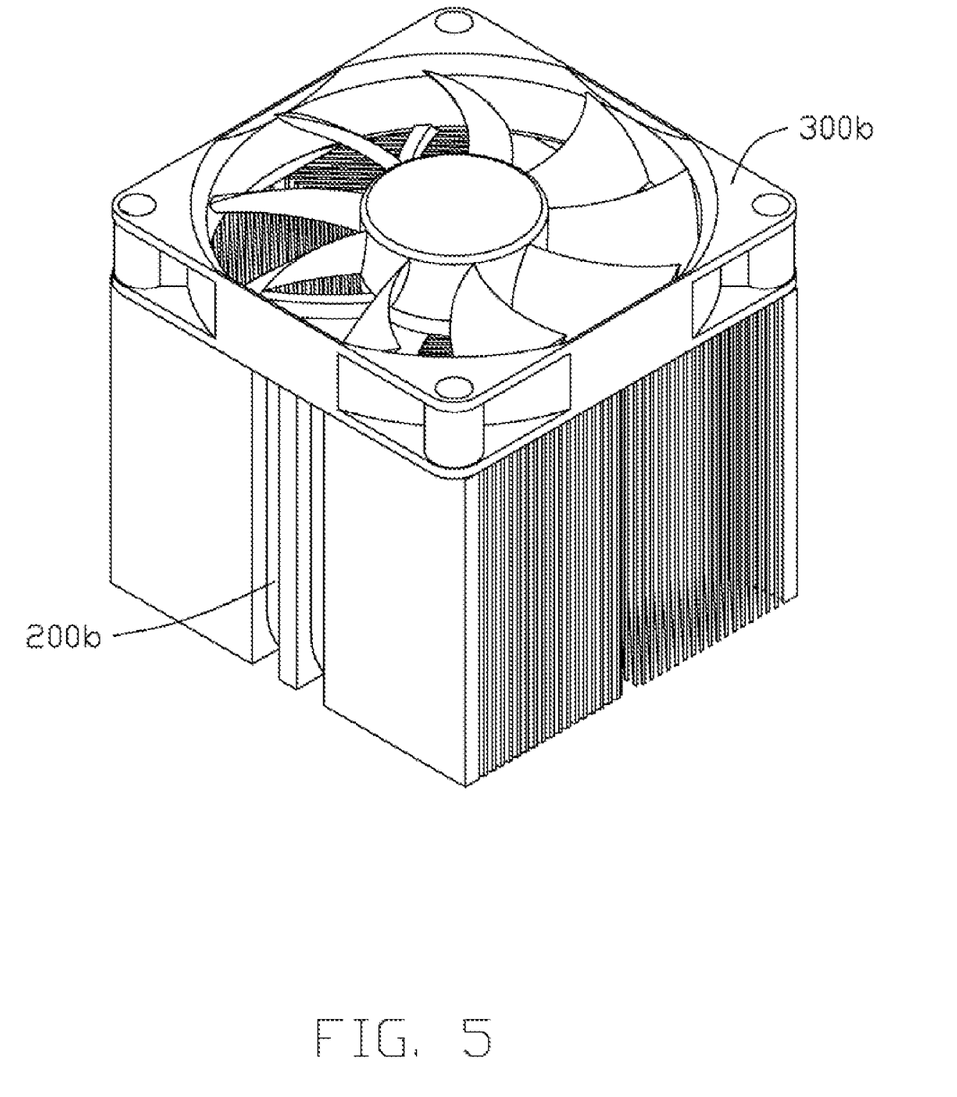
FIG. 5 is an assembled view of FIG. 3.

FIGS. 3-5 show a heat dissipation device 100*b* in accordance with a third embodiment of the present invention, together with related heat dissipating components, such as two U-shaped heat pipes 200*b* and a fan 300*b*. The heat dissipation device 100*b* is similar to the heat dissipation device 100 as described in the first preferred embodiment. The main difference therebetween is that two U-shaped channels 180*b* are defined in the heat absorbing member 120*b* of the heat dissipation device 100*b* at the bottom side and the front and rear plates 124*b*, 126*b* thereof, for receiving the heat pipes 200*b* therein. The U-shaped heat pipes 200*b* are soldered in the channels 180*b*.

Each U-shaped heat pipe 200*b* comprises two parallel arms 220*b* and a connecting arm 240*b* interconnecting the two parallel arms 220*b*. The heat pipe 200*b* is positioned in the corresponding U-shaped channel 180*b* of the heat-absorbing member 120*b* in such a manner that the two parallel arms 220*b* are respectively embedded in the front plate 124*b* and the rear plate 126*b*, and the connecting arm 240*b* is embedded in the bottom portion of the spreader 128*b*. Thus, the heat pipes 200*b* simultaneously contact three sides of the heat-absorbing member 120*b* except the top surface of the heat-absorbing member 120*b*, which is left for mounting the fan 300*b* thereon to blow an airflow downwards. Therefore, the heat dissipation device 100*b*, the fan 300*b* and the heat pipes 200*b* cooperatively form a heat dissipation device assembly as shown in FIG. 5.

For reducing the heat resistance between the heat pipes 200*b* and the CPU, a base 400*b* made of highly heat conductive material such as copper is employed. The base 400*b* has a flat bottom surface for directly contacting with the CPU, and a top surface having two parallel grooves 420*b* defined therein. The grooves 420*b* of the base 400*b* accommodate the connecting arms 240*b* of the heat pipes 200*b* therein. The connecting arms 240*b* are soldered in the grooves 420*b*. The heat generated by the CPU is first received by the base 400*b*, then transferred to the connecting arms 240*b* and then to the parallel arms 220*b*.

In this embodiment, the connecting arms 240*b* of the heat pipes 200*b* are sandwiched between the base 400*b* and the heat-absorbing member 120*b*, and serve as evaporators to absorb the heat from the base 400*b*. The parallel arms 220*b* of the heat pipes 200*b* serve as condensers to give out the absorbed heat to the heat-absorbing member 120*b* via phase transition. Then, the heat accumulated at the heat-absorbing member 120*b* is conducted to the fins 140*b* along different directions via the semicircular concave walls 1282*b*. Finally, the heat is quickly dissipated to ambient air under the help of the airflow produced by the fan 300*b*. In this embodiment, the fan 300*b* is mounted on a top of the heat dissipation device 100*b*.

Figure 6:
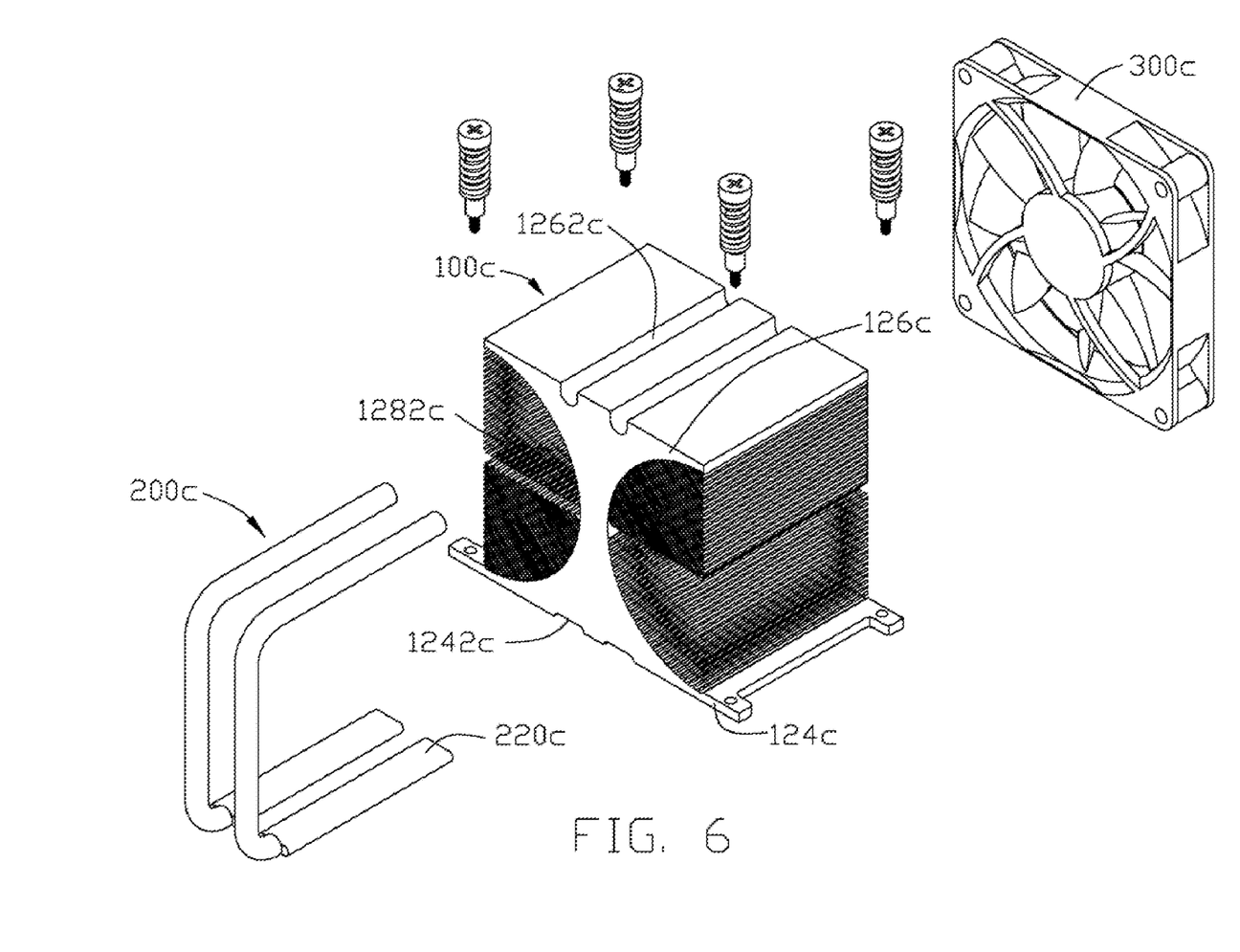
FIG. 6 is an isometric view of a heat dissipation device in accordance with a forth preferred embodiment, together with related heat dissipating components.
Figure 7:
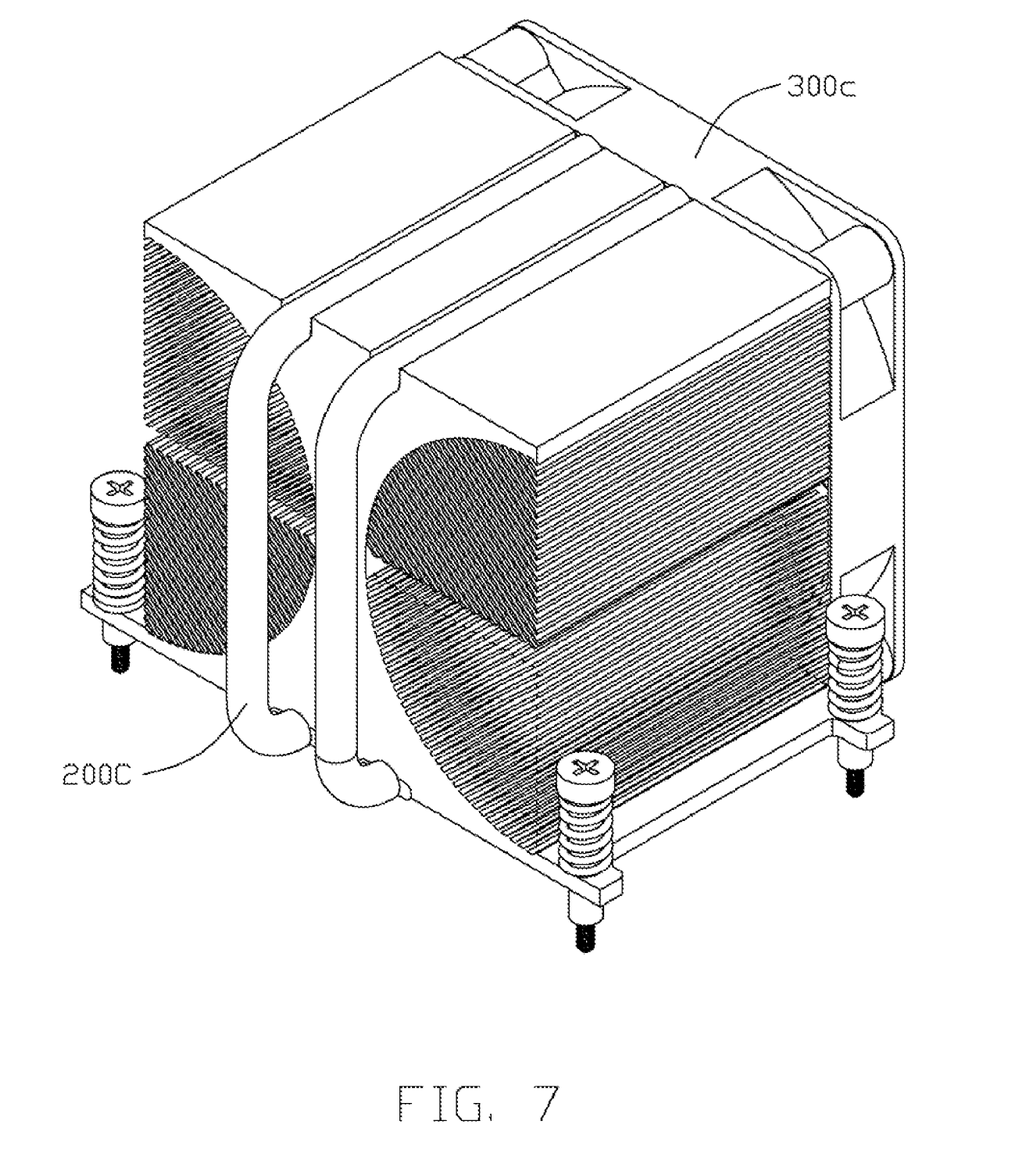
FIG. 7 is an assembled view of FIG. 6.

FIGS. 6-7 show a heat dissipation device 100*c* in accordance with a fourth embodiment of the present invention, together with related heat dissipating components, such as two U-shaped two heat pipes 200*c* and a fan 300*c*. The heat dissipation device 100*c* is similar to the heat dissipation device 100*a* as described in the second preferred embodiment. The difference therebetween is that the heat dissipation device 100*c* defines two parallel straight grooves 1262*c* in the rear plate 126*c* and two parallel straight grooves 1242*c* in the front plate 124*c*. The grooves 1262*c*, 1242*c* in the rear and front plates 126*c*, 124*c* are provided for retaining parallel arms 220*c* of the heat pipes 200*c* therein. One parallel arm 220*c* of each of the heat pipes 200*c* retained in the front plate 124*c* is flattened to directly contact with the CPU to absorb heat therefrom. In this embodiment, the front plate 124*c* is oriented downwardly to face the CPU. The fan 300*c* is mounted on a bottom side of the heat dissipation device 100*c* which is now oriented rearwards.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device, comprising:
   a heat-absorbing member having two arched concave walls, one of the arched concave walls being formed at a side of the heat-absorbing member and another of the arched concave walls being formed at an opposite side of the heat-absorbing member; and
   a plurality of fins extending outwardly from each the two arched concave walls of the heat-absorbing member toward a middle of the heat-absorbing member between a front end and a rear end thereof;
   wherein the heat-absorbing member comprises a spreader, which has a width gradually decreased from the front and rear ends towards the middle of the heat-absorbing member.

2. The heat dissipation device as claimed in claim 1, wherein the heat-absorbing member further comprises a front plate formed at the front end of the heat-absorbing member, and a rear plate formed at the rear end of the heat-absorbing member, and wherein the two arched concave walls are located between the front plate and the rear plate.

3. The heat dissipation device as claimed in claim 2, wherein any of the front plate, the rear plate and the spreader is selectable for contacting with a heat-generating electronic component.

4. The heat dissipation device as claimed in claim 2, wherein from the front plate extends two flanges at two opposite lateral sides thereof each flange having at least a mounting structure at an end thereof, the mounting structure being adapted for mounting the heat dissipation device to a printed circuit board.

5. The heat dissipation device as claimed in claim 1, wherein an arrangement of the fins at the side of the heat-absorbing member is a mirror image of the fins at the opposite side of the heat-absorbing member.

6. The heat dissipation device as claimed in claim 5, wherein at the side of the heat-absorbing member, a channel is defined to divide the fins thereof into a front group and a rear group, and the fins of the front group are oriented to point outwardly and rearwards toward the channel.

7. The heat dissipation device as claimed in claim 6, wherein the fins of the rear group are a mirror image of the fins of the front group regarding the channel.

8. The heat dissipation device as claimed in claim 6, wherein the fins of the front group are arranged to form a quadrant-shaped column.

9. The heat dissipation device as claimed in claim 1, wherein each of the arched concave walls has a semicircular shape.

10. A heat dissipation device assembly, comprising:
    a heat dissipation device comprising:
    a first plate;
    a second plate; and
    a spreader interposed between the first plate and the second plate, the spreader having a width which is first decreased and then increased along a direction from the first plate towards the second plate;
    a plurality of fins extending from two opposite lateral sides of the spreader towards a middle of the spreader between the first and second plates; and
    a heat pipe having an evaporator adapted for thermally connecting with a heat-generating electronic component, and a condenser for thermally connecting with at least one of the first plate, the second plate and the spreader.

11. The heat dissipation device assembly as claimed in claim 10, wherein the spreader has two semicircular walls each formed at a corresponding one of the opposite lateral sides thereof, and the two semicircular walls, the first plate and the second plate cooperate form two recesses for accommodating the fins therein.

12. The heat dissipation device assembly as claimed in claim 10, wherein the fins are divided into several groups, and the fins in each group are oriented to a same direction different from that of any of other groups.

13. The heat dissipation device assembly as claimed in claim 10, wherein the heat pipe is U-shaped, and comprises two first arms and a second arm interconnecting the two first arms.

14. The heat dissipation device assembly as claimed in claim 13, wherein two grooves are respectively defined in the first plate and the second plate, and the first arms of the heat pipe are respectively positioned in the grooves of the first plate and the second plate.

15. The heat dissipation device assembly as claimed in claim 13, wherein the spreader comprises a groove defined therein and communicated with the grooves of the first plate and the second plate, and the second arm of the heat pipe is positioned in the groove of the spreader.

16. The heat dissipation device assembly as claimed in claim 15, further comprising a base, the base having a flat bottom surface adapted for contacting with the heat-generating electronic component, and wherein the second arm of the heat pipe is positioned between the base and the heat dissipation device.

17. The heat dissipation device assembly as claimed in claim 15, wherein one of the two first arms is flattened to directly contact with the heat-generating electronic component.

18. The heat dissipation device assembly as claimed in claim 10, further comprising a fan, which is capable of producing an airflow flowing through the fins and the heat pipe in a line.

19. The heat dissipation device assembly as claimed in claim 18, wherein the fan is mounted on one of a top side and a rear side of the heat dissipation device.

* * * * *